(12) United States Patent
Gotoh et al.

(10) Patent No.: US 7,237,331 B2
(45) Date of Patent: Jul. 3, 2007

(54) ELECTRONIC PART MANUFACTURING METHOD AND ELECTRONIC PART

(75) Inventors: Masashi Gotoh, Tokyo (JP); Kaoru Kawasaki, Tokyo (JP); Mutsuko Nakano, Tokyo (JP); Hiroshi Yamamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 71 days.

(21) Appl. No.: 10/540,249

(22) PCT Filed: Dec. 17, 2003

(86) PCT No.: PCT/JP03/16160

§ 371 (c)(1),
(2), (4) Date: Jun. 22, 2005

(87) PCT Pub. No.: WO2004/059729

PCT Pub. Date: Jul. 15, 2004

(65) Prior Publication Data

US 2006/0086531 A1    Apr. 27, 2006

(30) Foreign Application Priority Data

Dec. 24, 2002  (JP) ............................. 2002-371672

(51) Int. Cl.
*H05K 3/36* (2006.01)
(52) U.S. Cl. ............................. 29/830; 29/842; 29/843; 29/846; 228/180.21
(58) Field of Classification Search .................. 29/830, 29/842, 843, 825, 846; 228/180.21
See application file for complete search history.

(56) References Cited

U.S. PATENT DOCUMENTS

| | | | |
|---|---|---|---|
| 3,835,531 A * | 9/1974 | Luttmer ....................... 29/843 |
| 4,991,285 A * | 2/1991 | Shaheen et al. ............... 29/830 |
| 5,600,103 A * | 2/1997 | Odaira et al. ................ 174/265 |
| 6,147,870 A * | 11/2000 | Pommer ...................... 361/746 |
| 6,420,664 B1 * | 7/2002 | Muramatsu et al. ......... 174/262 |
| 6,705,003 B2 * | 3/2004 | Motomura et al. ........... 29/830 |
| 6,729,022 B2 * | 5/2004 | Kurita et al. ................. 29/846 |
| 6,737,588 B1 * | 5/2004 | Kurita et al. ................ 174/254 |
| 6,865,801 B2 * | 3/2005 | Sasaoka et al. ............... 29/745 |
| 6,872,893 B2 * | 3/2005 | Fukuoka et al. ............. 174/255 |
| 6,884,709 B2 * | 4/2005 | Iijima et al. ................. 438/613 |
| 7,100,276 B2 * | 9/2006 | Fukuoka et al. .............. 29/830 |

FOREIGN PATENT DOCUMENTS

JP    61-181662    8/1986

(Continued)

OTHER PUBLICATIONS

U.S. Appl. No. 10/540,249, filed Jun. 22, 2005, Gotoh et al.
U.S. Appl. No. 10/546,873, filed Aug. 25, 2005, Gotoh et al.

*Primary Examiner*—Carl J. Arbes
(74) *Attorney, Agent, or Firm*—Oblon, Spivak, McClelland, Maier & Neustadt, P.C.

(57) ABSTRACT

Provided is a method of manufacturing an electronic part having a plurality of wiring patterns and an insulating layer interposed between the wiring patterns and serving to establish electrical connection between the wiring patterns through an interlayer connecting portion penetrating the insulating layer. In the method, a first step of forming a wiring pattern and a columnar conductor and a second step of forming a layer having a uniform thickness by bonding an insulating sheet from above and pressing the insulating sheet to the height of the columnar conductor with the columnar conductor as a stopper so as to conform the thickness of the insulating sheet to the height of the columnar conductor are repeated.

3 Claims, 5 Drawing Sheets

FOREIGN PATENT DOCUMENTS

| | | |
|---|---|---|
| JP | 6-57455 | 8/1994 |
| JP | 8-125331 | 5/1996 |
| JP | 9-237976 | 9/1997 |
| JP | 10-22636 | 1/1998 |
| JP | 10-70369 | 3/1998 |
| JP | 11-74636 | 3/1999 |
| JP | 2001-68810 | 3/2001 |
| JP | 2001-274554 | 10/2001 |
| JP | 2002-134881 | 5/2002 |
| JP | 2002-137328 | 5/2002 |

* cited by examiner

ELECTRONIC PART MANUFACTURING METHOD AND ELECTRONIC PART

TECHNICAL FIELD

The present invention relates to a method of manufacturing an electronic part and an electronic part, and particularly to a method of manufacturing an electronic part in which a columnar conductor is used for electrical junction between layers that serve as a laminating object and an electronic part.

BACKGROUND ART

Up to now, there have been known an electronic part and a print wiring board in which: wiring patterns are formed on an insulating layer; and the wiring patterns are laminated in a thickness direction thereof to form a multi-layer structure.

Various manufacturing methods of forming the multi-layer structure have been proposed and disclosed. FIG. 6A and FIG. 6B are step explanatory diagrams each showing a conventional step of manufacturing an electronic part for each layer.

In FIG. 6A, laser irradiation is performed to make a hole on a surface of an insulating layer 1. Then, a hole 2 is formed through laser processing, and thereafter, a conductor portion, which is composed of a film or has a columnar shape, is formed inside the hole 2 by filling a conductive paste into the hole 2 or performing plating.

In FIG. 6B, conductor portions 4 are formed on a surface of a preformed insulating layer 3 through plating or etching. After the conductor portions 4 are formed through the above step, an insulating resin 5 is applied onto a surface of each of the conductor portions 4 through spin coating (for example, refer to JP 10-22636 A).

Another method has been known in which: a bump composed of a conductive paste is formed on a wiring of a substrate; then, an interlayer connecting insulating member and a metal layer are arranged; the bump is made to penetrate into a forming resin through pressing; and resultingly, the bump is conductively connected with the metal layer (for example, refer to JP 2002-137328 A).

Further, a method has been disclosed in which: a penetrating hole is formed by means of a carbon dioxide gas laser or the like; a paste containing powder of a low-resistance metal such as gold, silver, copper, or aluminum is filled into the penetrating hole; and resultingly, a via hole conductor is formed (for example, refer to JP 2002-134881 A).

Moreover, a method has been disclosed in which: a resin is applied to the periphery of an interlayer connecting conductor post; and the resin is pressed through an emery paper-like mould releasing film having moderate roughness on its surface to form an insulating layer (for example, refer to JP 06-57455 B).

As regards the electronic part including a multi-layer structure, incorporating elements and the like into the electronic part has been examined with the aim of attaining a higher density and a higher function. Here, when an element such as a passive part is to be formed between wiring patterns overlapped in a lamination direction, a distance between the wiring patterns serves as an important factor that determines characteristics of the element. Thus, for the purpose of stabilizing the element characteristics, a method of manufacturing an electronic part has been desired in which the distance between the wiring patterns, that is, the thickness of each layer in the electronic part can be reliably controlled.

However, in the above-mentioned manufacturing method shown in FIG. 6A, it is only performed that: the insulating layer 1 is subjected to laser processing for making a hole; and the conductor portion is formed inside the hole 2. The thickness of the entire layer is not managed.

Further, in the manufacturing method shown in FIG. 6B, the resin is applied through spin coating to form an insulating resin layer so as to cover the conductor portion; however, a swell is generated on a surface of the insulating resin depending on the existence of the conductor portion 4. Thus, it has been difficult to uniformly set the thickness of the entire layer.

Moreover, a method of controlling the thickness of the entire layer has not been disclosed either in the method in which: a bump composed of a conductive paste is formed on a wiring on a substrate; and then, the bump is made to penetrate into a forming resin through pressing. Furthermore, also in JP 2002-134881 A, it is only performed that filling of the paste is conducted to form the via hole conductor, and the thickness of the entire layer is not controlled.

In JP 06-57455 B, after the pressing step is completed, the mould releasing film needs to be released from a surface of the insulating layer. However, an external force may act on the surface of the insulating layer due to this releasing operation, which causes deformation or the like on the surface of the insulating layer. Also, as in FIG. 6B, since the resin is applied to cover the conductor portion, a swell is generated on the surface of the insulating resin. Thus, it may be difficult to uniformly set the thickness of the entire layer.

In the mean time, in a general method of manufacturing an electronic part, it is generally performed that a surface of an insulating layer is roughened to improve adhesion property with respect to a copper foil that forms a wiring pattern. However, it is known that some of resins for forming an insulating layer are chemically stable, and thus, are difficult to be subjected to a roughening process with the use of chemicals. Therefore, a manufacturing method has been desired in which a bonding strength with respect to a wiring layer can be reliably secured even with the use of such a chemically stable resin.

DISCLOSURE OF THE INVENTION

In view of the above-mentioned conventional problems, the present invention provides a method of manufacturing an electronic part with a first object to achieve a uniform thickness of an insulating layer and a second object to reliably perform a roughening process independent of deformation due to an external action and a kind of a resin and an electronic part manufactured by using the manufacturing method.

The present invention has been made based on an understanding that: after a wiring pattern and a columnar conductor are formed, an insulating sheet is pressed from the upper side with the columnar conductor as a stopper; resultingly, a thickness of the sheet member conforms to a height of the columnar conductor; and thus, a layer having a uniform thickness can be formed in which unevenness (swell) is held to a minimum.

That is, according to the present invention, there is provided a method of manufacturing an electronic part which is provided with plural wiring patterns and an insulating layer that is interposed between the wiring patterns and in which electrical connection between the wiring patterns is established through an interlayer connecting portion that penetrates the insulating layer, in which:

a first step of forming the wiring pattern and a columnar conductor, and a second step of: bonding an insulating sheet from an upper side thereof; pressing the insulating sheet to a height of the columnar conductor with the columnar conductor as a stopper; and conforming a thickness of the sheet to the height of the columnar conductor to form a layer having a uniform thickness are repeatedly performed; and the columnar conductor, which determines a thickness of the layer, is used as the interlayer connecting portion.

In more detail, provided is a method of manufacturing an electronic part which is provided with plural wiring patterns and an insulating layer that is interposed between the wiring patterns and in which electrical connection between the wiring patterns is established through an interlayer connecting portion that penetrates the insulating layer, in which:

a first step of forming the wiring pattern and a columnar conductor, a second step of: bonding an insulating sheet from an upper side thereof; pressing the insulating sheet to a height of the columnar conductor with the columnar conductor as a stopper; and conforming a thickness of the sheet to the height of the columnar conductor to form a layer having a uniform thickness, and a third step of forming an uneven pattern for increasing an adhesion strength between the wiring pattern and the columnar conductor on a surface of the layer, which is formed in the second step are repeatedly performed; and the columnar conductor, which determines a thickness of the layer, is used as the interlayer connecting portion.

To be specific, provided is a method of manufacturing an electronic part which is provided with plural wiring patterns and an insulating layer that is interposed between the wiring patterns and in which electrical connection between the wiring patterns is established through an interlayer connecting portion that penetrates the insulating layer, in which:

a first step of forming the wiring pattern and a columnar conductor, a second step of: bonding an insulating sheet, which adheres to a cover layer through an uneven pattern, from an upper side thereof; pressing the insulating sheet to a height of the columnar conductor with the columnar conductor as a stopper; and conforming a thickness of the sheet to the height of the columnar conductor to form a layer having a uniform thickness, and a third step of: removing the cover layer from a surface of the layer, which is formed in the second step, through a chemical reaction; and exposing the uneven pattern for increasing an adhesion strength between the wiring pattern and the columnar conductor are repeatedly performed; and the columnar conductor, which determines a thickness of the layer, is used as the interlayer connecting portion.

Here, it is preferred that: particles having a spacer function are mixed into the resin sheet; the particles are sandwiched between the columnar conductor and the cover layer in the second step to form a thin film insulating layer on an upper surface of the columnar conductor; and after the uneven pattern is exposed in the third step, the thin film insulating layer is removed. Further, a thickness of the thin film insulating layer is preferably between 1 to 15 μm. Also, the columnar conductor is preferably formed by a metal plating process.

Moreover, according to the present invention, there is provided an electronic part, including wiring patterns and insulating layers that respectively cover the wiring patterns arranged at least in a thickness direction thereof in plural numbers, characterized in that: the wiring patterns, which are located while sandwiching the insulating layer, are connected to each other through a columnar conductor of which inside is formed dense; and a height of each of the insulating layers is conformed to a height of the columnar conductor. Further, the columnar conductor is preferably formed by a metal plating method.

According to the above-mentioned structure, after the wiring pattern and the columnar conductor are formed, the insulating sheet is bonded from the side above the wiring pattern and the columnar conductor. Then, the insulating sheet is pressed from the outer side after being bonded thereto, whereby the columnar conductor sinks into an inner portion of the insulating sheet. When the columnar conductor is taken into the inner portion of the insulting sheet by continuing the pressing, a head portion of the columnar conductor contacts the pressing side of the insulating sheet. The pressing of the insulating sheet is stopped at the position where the head portion of the columnar conductor contacts the pressing side of the insulating sheet as described above. Resultingly, the columnar conductor functions as the stopper, and the thickness of the insulating sheet (that is, the insulating layer) conforms to the height of the columnar conductor. Thus, the uniform layer thickness can be secured. Note that, needless to say, even if the head portion of the columnar conductor contacts the pressing side of the insulating sheet, those are not completely in contact with each other, and that a film composed of the insulating sheet is slightly interposed therebetween. Further, desirably used for the insulating sheet is a thermoplastic insulating sheet or a thermosetting insulating sheet in a B-stage state in which hardening is stopped at an intermediate stage. With such a resin, the columnar conductor can be easily taken into an inside thereof.

After the above operation is performed, minute unevenness to be an uneven pattern is formed on the surface of the insulating layer in the next step. As a result, a bonding strength in a pattern thickness direction and a pattern extension direction can be enhanced with respect to the wiring pattern formed as the upper layer of the insulating layer. Specifically, it is sufficient that a method be used in which: a stamper, which is preformed with unevenness on its surface, is approximated to or kept away from the surface of the insulating layer so that the unevenness on the stamper side is transferred onto the surface of the insulating layer; or an uneven surface is formed on the surface of the insulating layer in a non-contact manner by using a laser processing machine.

Further, the present invention is not limited to the above structure. When an insulating sheet, which adheres to a cover layer through an uneven pattern, is used, the uneven pattern can be exposed from a surface of the insulating sheet by removing the cover layer after the above steps are completed. Note that, since the uneven pattern is exposed through a chemical reaction, a mechanical force (what is called an external force) is not applied to the uneven pattern, which can avoid the occurrence of deformation and the like. Etching or other methods may be applied for the method of removing the cover layer through the chemical reaction.

In the mean time, when particles having a spacer function are mixed into the above-mentioned insulating sheet, whereby in the case where the insulating sheet is pressed to the head portion of the columnar conductor as the stopper, the particles are sandwiched between the head portion of the columnar conductor and the pressing side of the insulating sheet. Thus, a film having a uniform thickness, which is set in accordance with a particle diameter, that is, a thin film insulating layer can be formed above the head portion of the columnar conductor. Therefore, after bonding of the insulating sheet is performed, the thin film insulating layer is uniformly formed while the head portion of the columnar conductor is not exposed from the surface. As a result, in the subsequent step, a uniform process can be performed to the insulating layer (The head portion of the columnar conductor can be prevented from being damaged through a process such as etching. Also, a subsequent operation for removing the thin film insulating layer can be easily performed by forming the insulating layer in a form of a thin film.).

Note that, from the viewpoint of realizing both the protection of the head portion of the columnar conductor and the easiness of removal of the thin film insulating layer, the thickness of the thin film insulating layer is desirably set to 1 to 15 µm. In order to set the thickness of the thin film insulating layer to 1 to 15 µm, it is sufficient that the diameter of the particle be adjusted (Since realizing both the protection of the head portion and the removal easiness is an object, the thickness is not necessarily limited to the above range depending on the characteristics of the insulating resin to be used.).

The thickness of the film formed above the head portion of the columnar conductor is set to 1 to 15 µm, whereby the head portion of the columnar conductor can be sufficiently protected even after the following step such as etching is performed, and also, the film on the head portion of the columnar conductor can be removed easily by abrasive blasting or the like. Thus, both the characteristics can be satisfied.

Further, by forming the columnar conductor through a metal plating method, a conductor can be deposited in a dense state in a forming frame of the columnar conductor in comparison with a method in which a conductive paste containing a resin is embedded in a forming frame. Therefore, in the case where heat is generated in the substrate, the generated heat is transmitted through the columnar conductor to be radiated to the outside. The columnar conductor formed through the metal plating method has a high conductor density, and thus, is excellent in a heat transmitting characteristic. Accordingly, a larger amount of generated heat can be radiated to the outside of the substrate, and the temperature in the substrate can be prevented from rising. Further, needless to say, the enhancement of the conductor density attains a low resistivity.

BEST MODE FOR CARRYING OUT THE INVENTION

Hereinafter, detailed description will be made of a preferred and specific embodiment mode on a method of manufacturing an electronic part and an electronic part according to the present invention with reference to the accompanying drawings.

Figure 1:
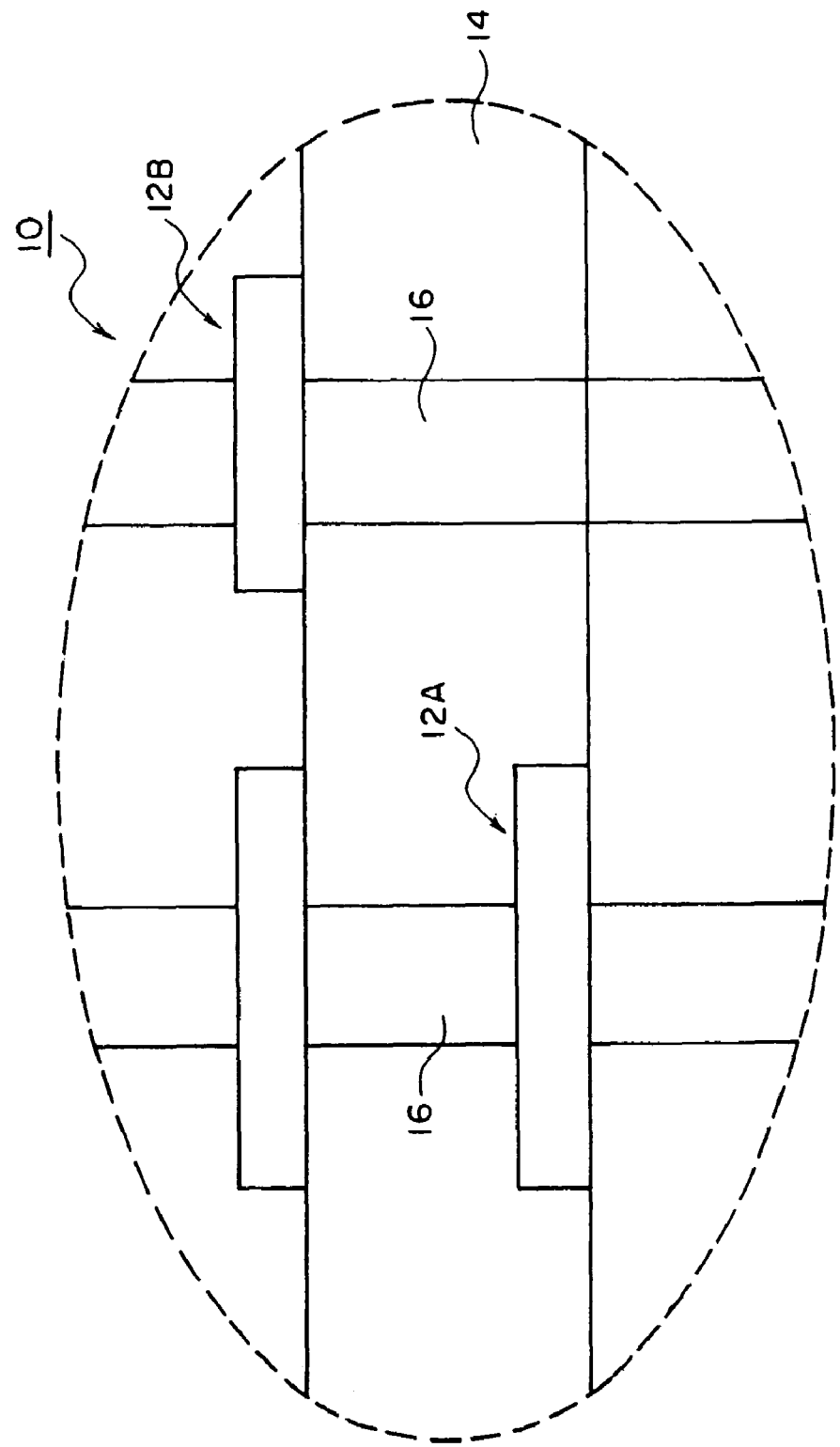
FIG. 1 is a sectional enlarged view of an electronic part in accordance with an embodiment mode of the present invention.

FIG. 1 is a sectional enlarged view of the electronic part in accordance with the embodiment mode of the present invention.

As shown in the figure, in an electronic part 10, which is manufactured by using a method of manufacturing a multi-layer print substrate in accordance with this embodiment mode, plural wiring patterns 12A and 12B are overlapped with each other in a thickness direction thereof (two stages in this embodiment mode). An insulating layer 14 is interposed between the wiring patterns 12A and 12B, and brings an insulating action between the wiring patterns and keeps a distance between the wiring patterns uniformly. Further, a columnar conductor 16 (what is called a post), which is to serve as an interlayer connecting portion, vertically rises from the wiring pattern 12A so as to penetrate the insulating layer 14, and connects with the wiring pattern 12B, whereby electrical connection between the wiring patterns is established.

The electronic part 10, which adopts the manufacturing method in accordance with this embodiment mode, has a mode in which: a thickness of each insulating layer 14 is uniform; and variation in thickness of the insulating layer 14 is held to a minimum.

Further, in the electronic part 10, an uneven pattern is formed on a surface of each insulating layer 14, which enables the enhancement of a bonding strength with respect to each wiring pattern formed on the surface of the insulating layer 14. Moreover, the columnar conductor 16 has a satisfactory heat transmitting characteristic because an inside thereof is formed dense. For example, even in the case where heat generation occurs at the wiring pattern or the like, the generated heat can be radiated to the outside of an apparatus through the columnar conductor 16. Therefore, the rise of a temperature in the apparatus can be avoided.

Hereinafter, description will be made of the method of manufacturing the electronic part 10 constituted as described above.

Figure 2A:
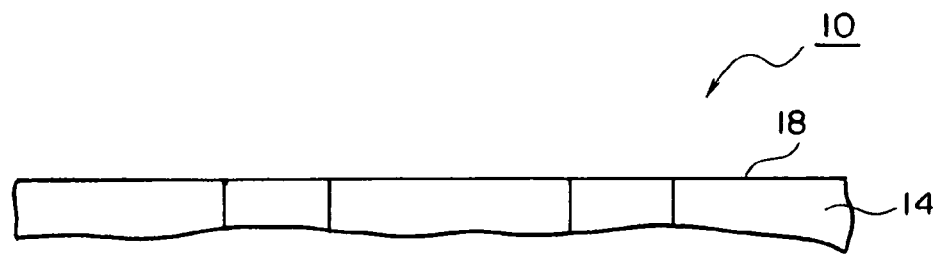
FIG. 2A, FIG. 2B, and FIG. 2C are schematic step explanatory views for explaining a method of manufacturing an electronic part in accordance with the embodiment mode.
Figure 2B:
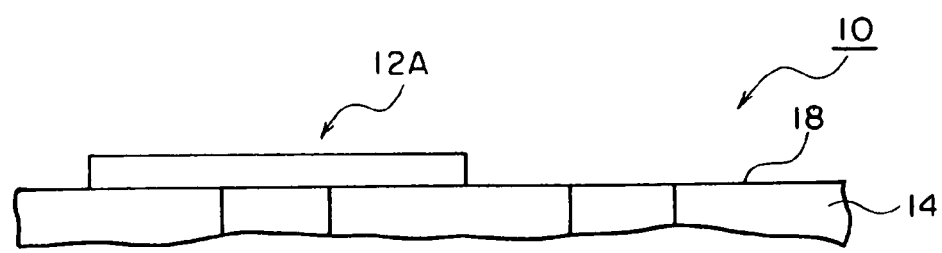
Figure 2C:
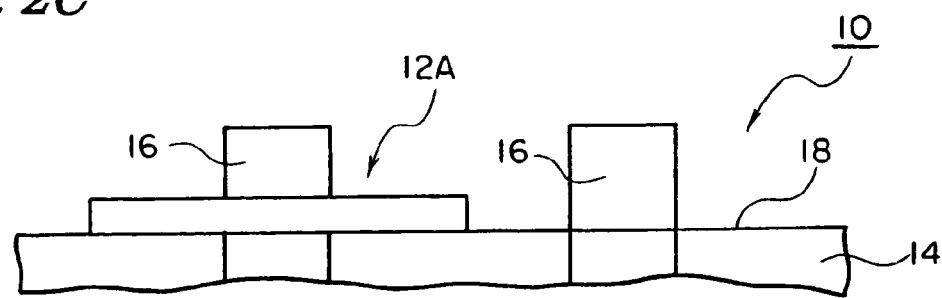

In order that the manufacturing method in accordance with this embodiment mode is applied to form layers in a lamination direction, first, as shown in FIG. 2A, a feeder film (not shown) for being used for a metal plating method is formed on a surface 12 of the electronic part 10, in which the wiring patterns are previously formed on the side of lower layers. After the formation of the feeder film, the wiring pattern 12A is formed on the surface 18 through bonding of a dry film to be a resist, exposure to the resist, a metal plating step, and the like. FIG. 2B shows the state in which the wiring pattern 12A has been formed. After the wiring pattern 12A is formed, it is sufficient that bonding of a dry film, exposure to the dry film, a metal plating step, and the like be also performed thereon, thereby forming the columnar conductor 16 on the wiring pattern 12A. FIG. 2C shows the state in which the columnar conductor 16 has been formed. Note that it has been described in this embodiment mode that the columnar conductor 16 is formed on the wiring pattern 12A; however, the present invention is not limited to this. For example, as shown in the right side in FIG. 2C, it is sufficient that the columnar conductor 16 be directly formed without forming the wiring pattern 12A. By using such a procedure, the columnar conductor 16 can be formed which substantially vertically rises from the surface 18 and also of which inside is dense.

Figure 3A:
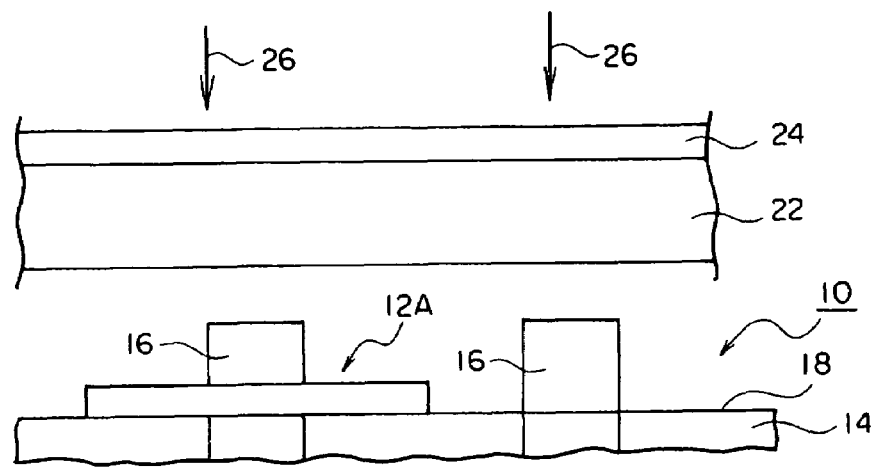
FIG. 3A, FIG. 3B, and FIG. 3C are schematic step explanatory views for explaining the method of manufacturing an electronic part in accordance with the embodiment mode.

After the wiring pattern 12A and the columnar conductor 16 are formed on the surface 18, a copper foil 24 with a resin 22, which serves as a thermoplastic insulating sheet or a thermosetting insulating sheet in a B-stage state, is lowered from the side above the columnar conductor 16 in a direction of arrows 26, as shown in FIG. 3A. Note that, desirably used for the resin 22 are compounds, for example, thermoplastic resins such as polyolefin, fluorocarbon-based resin, liquid crystal polymer, polyether ketone, and polyphenylene sulfide, and thermosetting resins such as unsaturated polyester resin, polyimide resin, epoxy-based resin, bis maleimide triazine resin, phenol resin, polyphenylene oxide, and polyvinyl benzyl ether. Contained in the resin 22 is a filler which has a spacer function and has a particle diameter for setting a thickness of a thin film insulating layer between 1 to 15 μm.

When a dielectric ceramic material is used as the filler, a dielectric characteristic of the insulating layer can be adjusted as to a usage object, for example, a high dielectric constant and low dissipation loss. The dielectric ceramic material used here is not particularly limited, but preferably has a dielectric constant relative (εr) of desirably 10 or more, more desirably 30 or more and a dielectric loss tangent (tan δ) of 0.005 or less. For the material as described above, given are titanium-barium-neodymium-based ceramic, lead-calcium-based ceramic, titanium dioxide-based ceramic, barium titanate-based ceramic, lead titanate-based ceramic, strontium titanate-based ceramic, calcium titanate-based ceramic, bismuth titanate-based ceramic, magnesium titanate-based ceramic, lead zirconate-based ceramic, and the like. Further, given are $CaWO_4$-based ceramic, $Ba(Mg,Nb)O_3$-based ceramic, $Ba(Mg,Ta)O_3$-based ceramic, $Ba(Co,Mg,Nb)O_3$-based ceramic, $Ba(Co,Mg,Ta)O_3$-based ceramic and the like. Among these materials, any single material may be used or any two types or more thereof may be mixed.

Further, the B-stage sheet is a sheet in which hardening of a thermosetting resin is stopped at an intermediate stage, and the sheet is melted once and then completely hardened through further heating. Note that the temperature in the case of performing further heating is desirably higher than a melting point or softening point of the resin. Further, pressure means, which is not shown in the figure but presses the cooper foil 24 with the resin 22, is provided on the opposite side of the copper foil 24 with respect to the side where the resin 22 is formed, and the means can simultaneously heat and press the copper foil 24 with the resin 22 against the electronic part 10 in a decompression environment (What is called heat pressing in a vacuum is performed.).

Figure 3B:
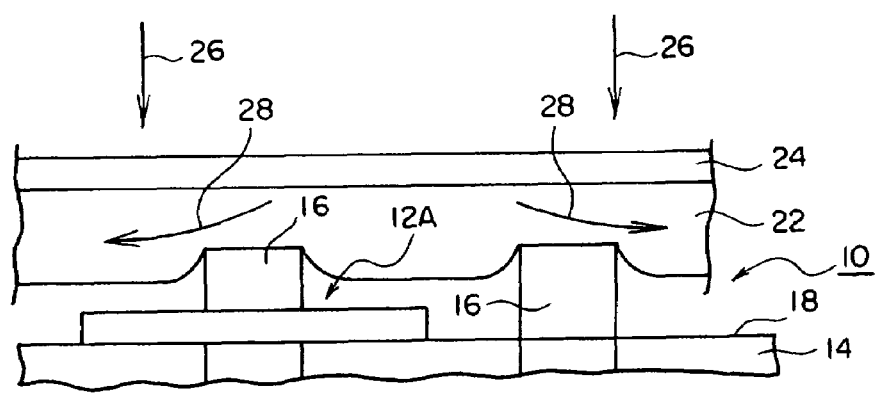
Figure 3C:
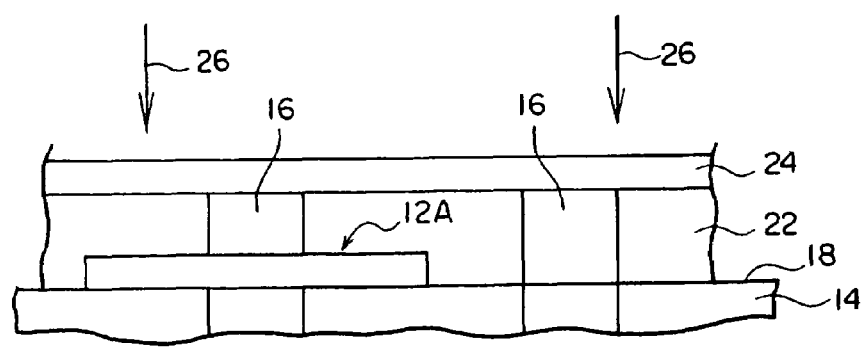
Figure 4:
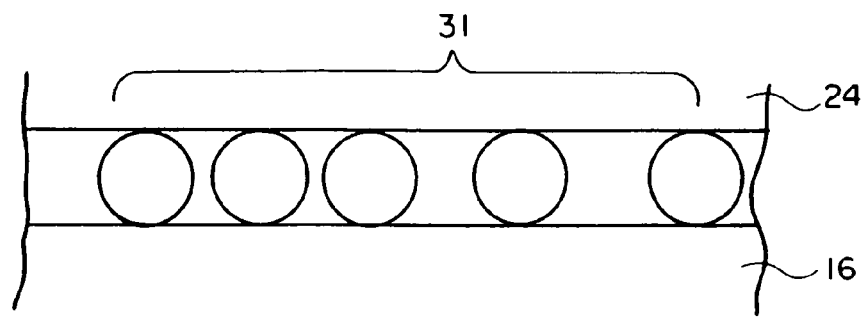
FIG. 4 is an enlarged view of an essential part on the midway of manufacturing the electronic part in accordance with the embodiment mode.

When the copper foil 24 with the resin 22 starts to be lowered in the direction of the arrows 26, the copper foil 24 with the resin 22 begins to contact the columnar conductor 16. After the lowering progresses further, the resin 22 pressed by the columnar conductor 16 moves in a direction of arrows 28, and the columnar conductor 16 sinks in an inner portion of the resin 22. This state is shown in FIG. 3B. Then, when the copper foil 24 with the resin 22 is further lowered after the columnar conductor 16 is made to sink in the inner portion of the resin 22, the columnar conductor 16 further sinks in the inner portion of the resin 22. Then, the columnar conductor 16 contacts the copper foil 24 through the filler, as shown in FIG. 3C. Moreover, an enlarged view of an essential portion in FIG. 3C is FIG. 4 (the filler 31).

When the top of the columnar conductor 16 contacts the copper foil 24 as described above, the columnar conductor 16 functions as a stopper to receive a pressing force from the pressing means, and stops the lowering of the pressing means. Here, when the lowering stops, the pressing means detects this to judge that the cooper foil 24 has contacted the columnar conductor 16, and completes the lowering operation. Then, the pressing means holds the state in which the top of the columnar conductor 16 contacts the copper foil 24 until the resin 22 is hardened. After the resin 22 is hardened, and the resin 22 becomes the insulating layer 14 that surrounds a peripheral surface of the columnar conductor 16, the pressing means is retreated above. Thereafter, the copper foil 24 is removed from the insulating layer 14 through etching serving as a chemical reaction.

Figure 5A:
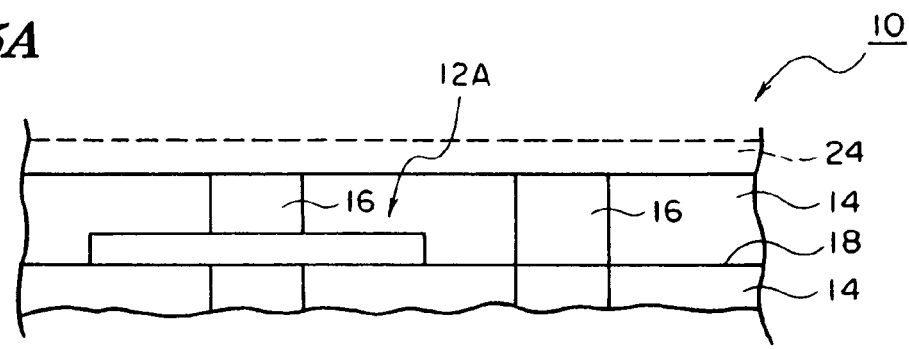
FIG. 5A and FIG. 5B are schematic step explanatory views for explaining the method of manufacturing an electronic part in accordance with the embodiment mode.

Subsequently, as shown in FIG. 5A, the copper foil 24 is removed from the insulating layer 14 through etching serving as a chemical reaction. As a result, the surface formed with an uneven pattern (that is, the roughened surface) is exposed from the insulating layer 14. Here, the top portion of the columnar conductor 16 is formed with a thin film insulating layer, which is set in accordance with a particle diameter of the filler 31, thereon, and thus, can be prevented from being damaged by a solution for etching. Note that abrasive blasting or the like is performed to the thin film insulating layer located at the top portion of the columnar conductor 16 with an area of the top portion as a target after the completion of the etching step, whereby the thin film insulating layer can be removed easily.

Figure 5B:
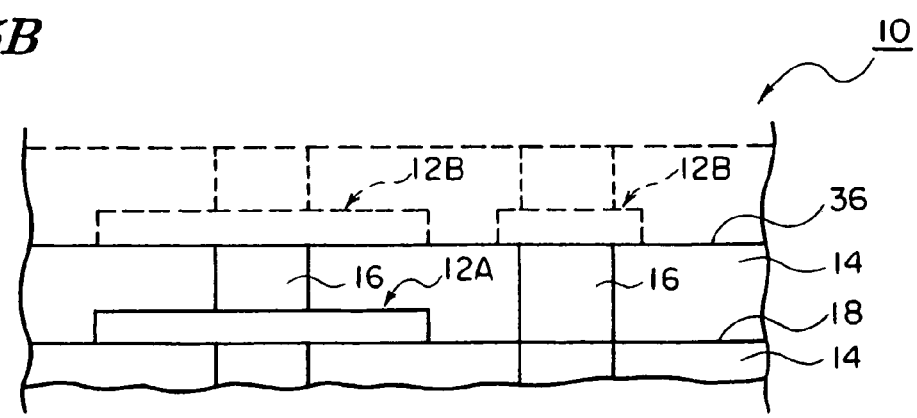
Figure 6A:
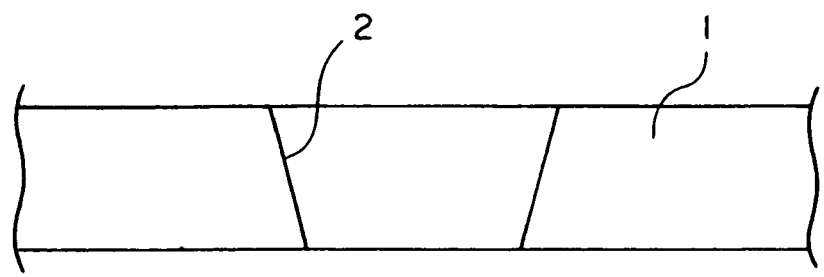
FIG. 6A and FIG. 6B are step explanatory views each showing a conventional method of manufacturing an electronic part for each layer.
Figure 6B:
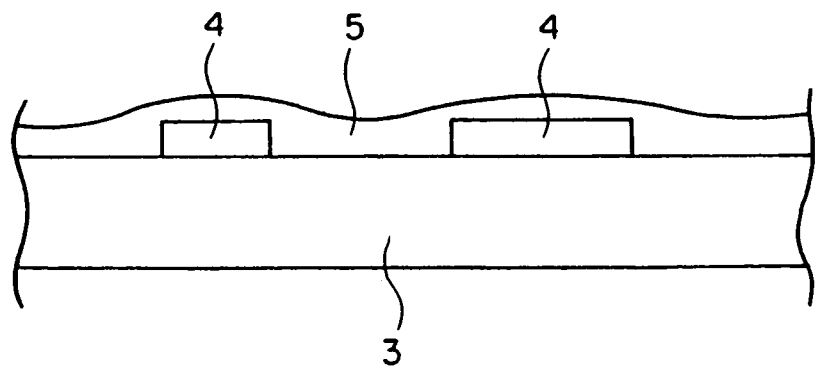

As described above, on a surface 36 of the insulating layer 14, which is formed through the series of steps, there exist the area of the insulating layer where the uneven pattern is formed and the area where the top portion of the columnar conductor 16 is exposed. Therefore, by repeating the above-mentioned steps, plural new layers can be formed as upper layers on the surface 36 as shown in FIG. 5B. Accordingly, the electronic part 10 can be constituted which includes the lamination structure as shown in FIG. 1.

As described above, according to the present invention, there is provided the method of manufacturing the electronic part which is provided with the plural wiring patterns and the insulating layer interposed between the wiring patterns and in which the electrical connection between the wiring patterns is established through the interlayer connecting portion that penetrates the insulating layer. Repeatedly performed in the manufacturing method are the first step of forming the wiring pattern and the columnar conductor and the second step of: bonding the insulating sheet from the upper side; pressing the insulating sheet to the height of the columnar conductor with the columnar conductor as the stopper; and conforming the sheet thickness to the height of the columnar conductor to form the layer having a uniform thickness. Thus, the columnar conductor that determines the layer thickness is used as the interlayer connecting portion. Accordingly, the unevenness is suppressed, thereby reliably controlling the layer thickness of the electronic part. Also, the roughening process can be reliably performed independent of the kind of the resin. In addition, the reduction in resistance and heat radiation effect of the conductor portion can be enhanced.

The invention claimed is:

1. A method of manufacturing an electronic part including plural wiring patterns and an insulating layer interposed between the wiring patterns and in which electrical connection between the wiring patterns is established through an interlayer connecting portion that penetrates the insulating layer, the method comprising:

a first step of forming the wiring pattern and a columnar conductor;

a second step of bonding an insulating sheet from an upper side thereof, pressing the insulating sheet to a height of the columnar conductor with the columnar conductor as a stopper, and conforming a thickness of the sheet to the height of the columnar conductor to form a layer having a uniform thickness; and a third step of removing a cover layer from a surface of the layer, which is formed in the second step, through a chemical reaction, and exposing an uneven pattern for increasing an adhesion strength between the wiring pattern and the columnar conductor;

wherein the columnar conductor, which determines a thickness of the layer, is used as the interlayer connecting portion and particles having a spacer function are mixed into the insulating sheet, and the particles are sandwiched between the columnar conductor and the cover layer in the second step to form a thin film insulating layer on an upper surface of the columnar conductor.

2. A method of manufacturing an electronic part according to claim 1, wherein a thickness of the thin film insulating layer is between 1 to 15 μm.

3. A method of manufacturing an electronic part according to claim 1, wherein the columnar conductor is formed by a metal plating method.

* * * * *